United States Patent
Gardner et al.

(10) Patent No.: US 6,239,476 B1
(45) Date of Patent: May 29, 2001

(54) INTEGRATED CIRCUIT ISOLATION STRUCTURE EMPLOYING A PROTECTIVE LAYER AND METHOD FOR MAKING SAME

(75) Inventors: Mark I. Gardner, Cedar Creek; Thomas E. Spikes, Jr., Round Rock; H. Jim Fulford, Jr., Austin, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/176,132

(22) Filed: Oct. 21, 1998

(51) Int. Cl.[7] ............ H01L 29/00; H01L 29/06; H01L 21/76
(52) U.S. Cl. .......... 257/513; 257/510; 257/622; 438/424
(58) Field of Search ................ 257/513, 622, 257/506, 510; 438/424, 425

(56) References Cited

U.S. PATENT DOCUMENTS

| | | | |
|---|---|---|---|
| 4,729,006 | 3/1988 | Dally et al. ............ | 357/42 |
| 5,433,794 | 7/1995 | Fazan et al. ............ | 148/33.3 |
| 5,581,110 | * 12/1996 | Razouk et al. ............ | 257/513 |
| 5,733,383 | 3/1998 | Fazan et al. ............ | 148/33.3 |

OTHER PUBLICATIONS

Wolf et al., "Silicon Processing for the VLSI Era, vol. 1: Process Technology," p. 184.

* cited by examiner

Primary Examiner—Wael Fahmy
Assistant Examiner—Neal Berezny
(74) Attorney, Agent, or Firm—Kevin L. Daffer; Conley, Rose & Tayon P.C.

(57) ABSTRACT

A method for fabricating an integrated circuit is presented wherein a trench is patterned in a field region of a semiconductor substrate. The trench is defined within the semiconductor substrate by a trench floor and trench sidewalls. A trench surface boundary is defined where the trench sidewalls intersect the upper surface of the semiconductor substrate. The trench may be filled with a trench fill material. A protective layer is then formed above the trench. The protective layer covers the trench and laterally extends above the semiconductor substrate at least a first distance beyond the trench surface boundaries.

16 Claims, 7 Drawing Sheets

INTEGRATED CIRCUIT ISOLATION STRUCTURE EMPLOYING A PROTECTIVE LAYER AND METHOD FOR MAKING SAME

BACKGROUND OF THE INVENTION

1. Field of the Invention

This invention relates to semiconductor processing and, more particularly, to a method of forming an isolation structure in a semiconductor substrate that reduces the chance of the isolation structure becoming recessed below the surface of the substrate.

2. Description of the Related Art

The fabrication of an integrated circuit involves the formation of numerous devices within active areas of a semiconductor substrate. Isolation structures are needed to electrically isolate one device from another. Isolation structures define the field regions of the semiconductor substrate, and the device areas define the active regions. The devices may be interconnected with conductive lines running over the isolation structures.

A popular isolation technology used in the fabrication of integrated circuits involves locally oxidizing silicon. In local oxidation of silicon ("LOCOS") processes, an oxide layer is first grown upon a silicon substrate. A silicon nitride ("nitride") layer is deposited upon the oxide layer. The oxide layer serves as a pad layer for the nitride layer. The surface of a field region of the silicon substrate is then exposed by etching portions of the nitride layer and oxide layer above this region. Active regions of the silicon substrate remain covered by the nitride layer, which is used as a mask to prevent oxidation of these regions in subsequent steps. A dopant implant is performed in the field region to create a channel-stop doping layer. The exposed portion of the silicon substrate within the field region is then oxidized. The silicon dioxide ("oxide") grown in the field region is termed field oxide. By growing a thick field oxide in isolation (or field) regions pre-implanted with a channel-stop dopant, LOCOS processing can help to prevent the establishment of parasitic channels in the field regions.

Although LOCOS has remained a popular isolation technology, the basic LOCOS process described above has several problems. When growing the field oxide, oxide growth should ideally be contained within the field region. In reality, however, some oxide growth may occur in a lateral direction, causing the field oxide to grow under and lift the edges of the nitride layer. Because the shape of the field oxide at the nitride edges is that of a slowly tapering wedge that merges into the pad oxide, the wedge is often described a bird's beak. In many instances, formation of the bird's beak can cause unacceptable encroachment of the field oxide into the active regions. In addition, the high temperatures associated with field oxide growth often cause the pre-implanted channel-stop dopant to migrate towards adjacent active regions. An increase in the dopant concentration near the edges of the field oxide can create a reduction in the drain current, an outcome that is often described as the narrow-width effect. Furthermore, thermal oxide growth is significantly less in small field regions (i.e., field areas of narrow lateral dimension) than in large field regions. Because of this reduction in oxide growth, an undesirable phenomenon known as the field-oxide-thinning effect may occur in small field regions. Field-oxide-thinning can produce problems with respect to field threshold voltages, interconnect-to-substrate capacitance, and field-edge leakage in small field regions between closely spaced active areas.

Despite advances made to decrease the bird's beak, channel-stop encroachment and non-planarity problems, it appears that LOCOS technology is still inadequate for deep submicron technologies. Many of the problems associated with LOCOS technology are alleviated by an isolation technique known as trench isolation. Trench isolation methods are primarily characterized by the depth at which the trenches are formed: either shallow (<1 micron), moderate (1–3 microns), or deep (>3 microns). Of these, shallow trench isolation ("STI") is particularly popular in integrated circuit fabrication processes.

Figures 1, 2:
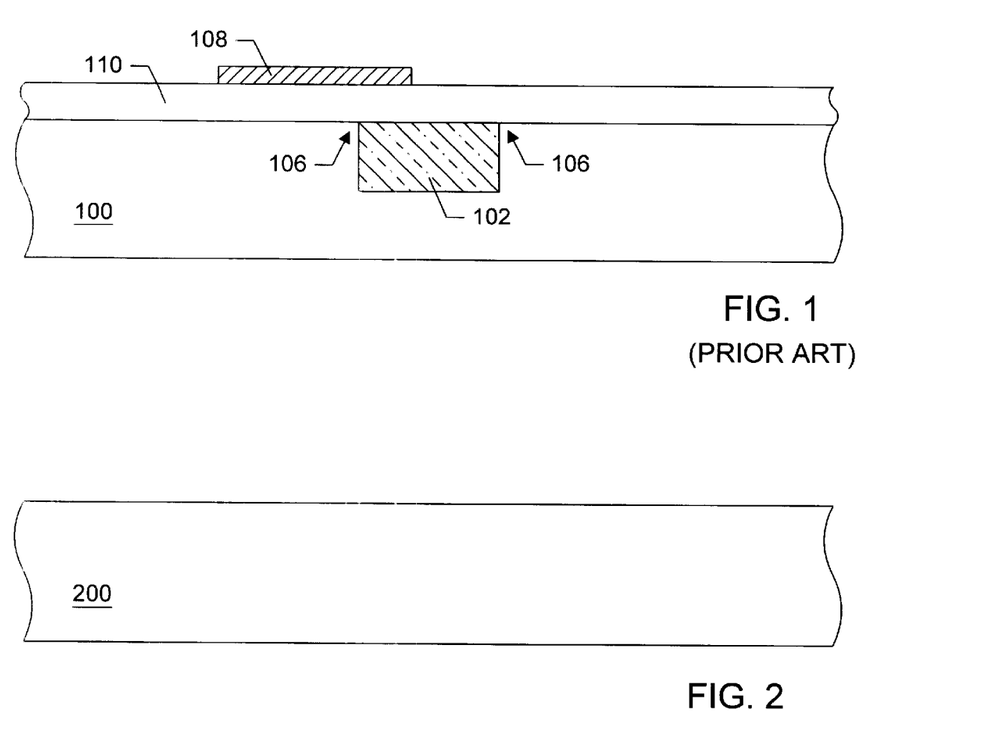
FIG. 1 is a partial cross-sectional view of a conventional STI structure disposed within a silicon substrate.
FIG. 2 is a partial cross-sectional view of a semiconductor topography in accordance with the present invention.

An isolation structure formed by a conventional shallow trench isolation process (hereinafter "the conventional STI process") is shown in FIG. 1. Silicon substrate 100 is a lightly doped wafer of single crystal silicon. The conventional STI process includes an initial step in which a relatively shallow trench (e.g., between 0.3 and 0.5 microns in depth) is etched in silicon substrate 100. The trench is then filled with trench dielectric 102, which is usually a deposited oxide. Some trench processes also include an intermediate step of growing an oxide liner on the trench floor and sidewalls before filling the trench with trench dielectric 102. After the trench is filled, the upper surface of trench dielectric 102 is then made coplanar with the upper surface of silicon substrate 100 to complete the isolation structure. In further processing, an interlevel dielectric layer 110 is typically deposited over the planarized surface. Conductive pattern 108 may be deposited and patterned over dielectric layer 110. Conductive pattern 108 includes metal lines used as global interconnection between devices, or alternatively, doped polysilicon used either as localized interconnect or as gate conductors of transistor gates.

The conventional STI process eliminates many of the problems of LOCOS techniques, including bird's beak and channel-stop dopant redistribution. STI processes are also better suited than LOCOS processes for isolating densely spaced active devices having field regions less than one micron wide. In addition, the trench isolation structure formed in STI processes is fully recessed, offering at least the potential for a planar surface. Moreover, field-oxide thinning in narrow isolation spaces is less likely to occur when using the shallow trench process. But despite its many advantages over LOCOS techniques, the conventional trench isolation process described above nevertheless has its own set of drawbacks.

One drawback of the conventional STI process results from the formation of sharp upper corners 106 where the sidewalls of trench 102 intersect with the surface of semiconductor substrate 100. Sharp upper corners 106 are typically a result of the highly directional etch used to form the trench. Sharp upper corners 106 may introduce certain undesirable effects during subsequent processing steps that can influence an integrated circuit's operation.

For instance, sharp upper corners 106 tend to congregate the electric fields in dielectric layer 110, which causes bunching of electric fields in the corner area. Because of this bunching of the electric field, the corner has a lower threshold voltage ($V_T$) than the planar surfaces adjacent the trench corner. Consequently, the performance of a transistor formed in an adjacent active area is less than optimal since the transistor will experience a threshold gradient from the center of the channel to the edge of the channel where the electric fields are bunched.

The conventional STI process also includes a step in which trench dielectric 102 is planarized (this step is done before the formation of dielectric layer 110). After the planarization step, the upper surface of the trench dielectric is somewhat coplanar with the upper surface of semiconductor substrate 100. Subsequent processing steps, however, may lead to the upper surface of trench dielectric 102 being displaced significantly below the surface of semiconductor substrate 100. This is due, in part, to the removal of the nitride masking layer which, during removal, etches away a portion of the trench dielectric 102 laterally adjacent to the masking layer. Further, various cleaning procedures alone will attack and remove the trench dielectric.

For example, chemical-mechanical polishing ("CMP") is often used to planarize the trench dielectric. CMP is usually described as a "dirty" procedure because of the polishing-slurry particles and other residues that accumulate upon the surface of the semiconductor topography during the process. These contaminants must be cleaned from the semiconductor topography after the CMP process is complete. The RCA cleaning method commonly used to clean such contaminants also removes the upper surface of the trench dielectric to a slightly greater degree than the adjacent silicon within semiconductor substrate 100. In addition, steps that involve the etching of oxide layers may result in the recession of the upper surface of trench dielectric 102 below the upper surface of semiconductor substrate 100. Examples of such steps include stripping the sacrificial oxide layer commonly grown upon the silicon substrate before deposition of the gate oxide and etching an oxide layer deposited over a gate electrode to form sidewall spacers.

One problem caused by recession of the upper surface of trench dielectric 102 below the surface of silicon substrate 100 is further reduction of the isolation voltage at sharp upper corners 106. This reduction is believed to be caused by the increased electric field bunching that can result from recession of the trench dielectric upper surface. The increase in electric field bunching caused by recession of trench dielectric 102 below the surface of silicon substrate 100 can cause dielectric layer 110 to unexpectedly breakdown during operation of the circuit.

In addition to the issues discussed above, recession of the upper surface of trench dielectric 102 below the surface of semiconductor substrate 100 may also cause problems during silicide formation. After dopants have been implanted into source/drain junctions of the active regions between the gate conductor and adjacent trench dielectric structures, highly conductive ohmic contacts must be formed between the source/drain junctions and overlying interconnect. A self-aligned silicide ("salicide") is typically formed at the juncture between the ohmic contacts and the junctions. Salicide formation involves deposition of a refractory metal across the semiconductor topography followed by heating the refractory metal such that the metal reacts with the underlying silicon. Thus, a highly conductive silicide is formed upon the junctions.

If a trench dielectric is recessed below adjacent source/drain junctions such that sidewalls of the silicon substrate are exposed, silicide formation will occur upon those exposed sidewalls. Unfortunately, the relatively low resistivity silicide can form a conductive pathway between the source/drain junctions and the oppositely-doped underlying silicon substrate or well region. The presence of the conductive pathway may cause majority charge carriers to be drawn away from rather than toward the channel region of the transistor during operation. This shorting of the source-to-drain current flow can lead to inoperability of the transistor.

Therefore, it would be desirable to design a method for fabricating an isolation structure that reduced the chance of the isolation structure becoming recessed below the surface of the semiconductor substrate in which it was formed.

SUMMARY OF THE INVENTION

The problems described above are in large part addressed by the method for fabricating an integrated circuit presented herein. Broadly speaking, a method is provided for forming an integrated circuit having a trench patterned in a field region of a semiconductor substrate. The trench is defined within the semiconductor substrate by a trench floor and trench sidewalls. A trench surface boundary is defined where the trench sidewalls intersect the upper surface of the semiconductor substrate. The trench may be filled with a trench fill material. A protective layer is then formed above the trench. The protective layer covers the trench and laterally extends above the semiconductor substrate at least a first distance beyond the trench surface boundaries.

The protective layer is preferably composed of nitride and is substantially free of oxide. Consequently, oxide etch steps occurring after trench formation may be undertaken such that substantial portions of the protective layer are not removed. Furthermore, by not only covering the trench but also extending beyond the trench surface boundaries by at least a first distance, the protective layer can greatly reduce the likelihood of the trench fill dielectric being exposed to an etchant. Because it is desirable to prevent any erosion of the trench fill material at the trench surface boundaries, the first distance is preferably no less than about 0.02 microns. To keep from encroaching on the adjacent active regions too much, however, the first distance is preferably no greater than 0.10 microns. The protective layer is preferably at least 30 angstroms thick to help ensure that the trench fill material remains protected during all subsequent processing steps. The protective layer is preferably no greater than 200 angstroms thick, however, because of step height problems and other difficulties that may be caused by an isolation structure that is too far above the surface of the semiconductor substrate.

In an embodiment, the trench is patterned by first forming a pad layer upon the semiconductor substrate. The pad layer is preferably composed of oxide and serves to reduce stresses between the semiconductor substrate and a subsequently deposited masking layer. The masking layer is preferably composed of nitride. A window may then be formed in the masking layer and the pad layer by an anisotropic etch process. The window defines the pattern for the trench. The trench is subsequently formed in the semiconductor substrate, preferably in an anisotropic dry etch process. The trench is preferably filled with a trench fill material until the trench fill material overflows the trench, leaving the upper surface of the trench fill material above the upper surface of the masking layer. The trench fill material preferably contains oxide. The protective layer may then be formed by first planarizing the trench fill material such that the upper surface of the trench fill material is substantially coplanar with the upper surface of the masking layer. An upper portion of the trench fill material may then be removed such that the upper surface of the trench fill material is below the upper surface of the masking layer. The masking layer may then be removed, and a covering layer is then blanket deposited upon the trench fill material as well as the adjacent topography. The covering layer is preferably composed of nitride. The covering layer may then be patterned such that the protective layer is formed.

In another embodiment, the protective layer is formed by first planarizing the trench fill material such that the upper surface of the trench fill material is substantially coplanar with the upper surface of the masking layer. An upper portion of the trench fill material is then preferably removed such that the upper surface of the trench fill material is below the upper surface of the masking layer. A covering layer may be deposited upon the masking layer and trench fill material. The covering layer is preferably planarized such that the upper surface of the covering layer is substantially coplanar with the upper surface of the masking layer. In addition, planarization may also be carried out such that the thicknesses of both the covering layer and the masking layer are about 30–200 angstroms. Since the covering layer may be subsequently patterned such that the protective layer is formed, planarization preferably ensures that the thickness of the protective layer will not have to be reduced after formation.

In another embodiment, the protective layer is formed by first planarizing the trench fill material such that the upper surface of the trench fill material is substantially coplanar with the upper surface of the masking layer. An upper portion of the trench fill material is then preferably removed such that the upper surface of the trench fill material is below the upper surface of the masking layer. A covering layer may be deposited upon the masking layer and trench fill material. As discussed above, planarization of a covering layer deposited at least partially on the masking layer can be used to get the thickness of the resulting layer within the 30–200 angstrom thickness range desired for the protective layer. In this embodiment, however, the combined thickness of the covering layer and masking layer is about 30–200 angstroms. Consequently, planarization of the covering layer may not be necessary. The covering layer and masking layer may be subsequently patterned such that the protective layer is formed.

A semiconductor topography is also presented. The semiconductor topography contains a trench disposed within a field region of a semiconductor substrate. The trench is defined in an upper portion of the semiconductor substrate by a trench floor and trench sidewalls. Trench surface boundaries are defined where the trench sidewalls intersect the upper surface of the semiconductor substrate. A protective layer is preferably arranged above the trench. The protective layer covers the trench and laterally extends above the semiconductor substrate at least a first distance beyond the trench surface boundaries. The protective layer is preferably composed of nitride.

BRIEF DESCRIPTION OF THE DRAWINGS

Other objects and advantages of the invention will become apparent upon reading the following detailed description and upon reference to the accompanying drawings in which:

FIG. 15b is top view of the semiconductor topography shown in FIG. 15a;

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Referring now to the drawings, FIGS. 2–15 illustrate an embodiment of a process sequence for forming an isolation structure within a field region of a semiconductor substrate. FIG. 2 shows a partial cross-sectional view of semiconductor substrate 200. Semiconductor substrate 200 is preferably a wafer of single crystal silicon. Semiconductor substrate 200 may be lightly doped n-type or p-type.

Figure 3:
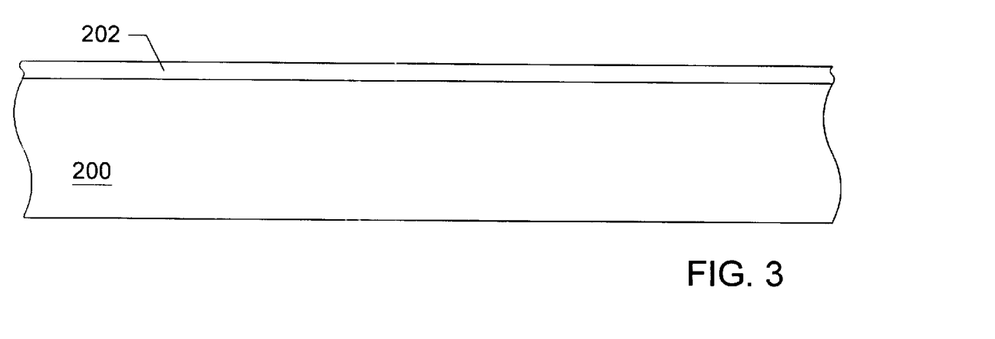
FIG. 3 is a partial cross-sectional view of the semiconductor topography, wherein a pad layer is formed upon the semiconductor substrate according to an initial processing step subsequent to FIG. 2.

FIG. 3 depicts the formation of pad layer 202 upon semiconductor substrate 200. Pad layer 202 is preferably composed of oxide, and is either deposited or grown. Pad layer 202, if composed of oxide, may be grown in a rapid thermal annealing ("RTA") process at a temperature of about 900–1050° C. for about 10–30 seconds in an oxygen-containing ambient. Alternately, a furnace anneal at a temperature of about 750–900° C. for 5–15 minutes in an oxygen-containing ambient may be used. The ambient in which annealing is undertaken may also contain nitrogen such that a substantial quantity of nitrogen is incorporated in pad layer 202. The thickness of pad layer 202 is preferably about 50–200 angstroms.

Figure 4:
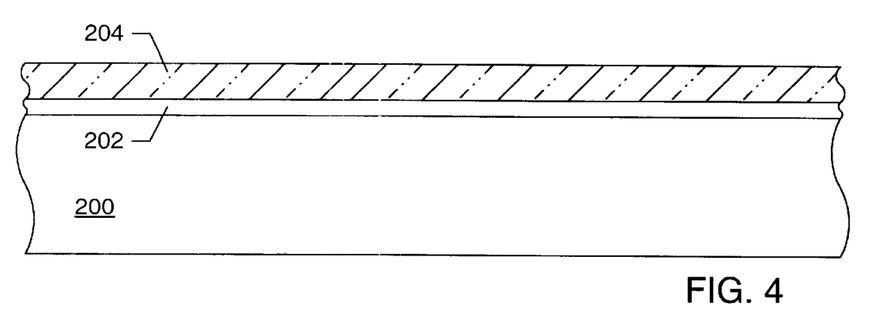
FIG. 4 is a partial cross-sectional view of the semiconductor topography, wherein a masking layer is formed upon the pad layer according to a processing step subsequent to FIG. 3.

FIG. 4 shows the formation of masking layer 204 upon pad layer 202. Masking layer 204 is preferably composed of a material that is substantially resistant to oxidation and substantially impervious to the diffusion of oxidants into any underlying materials. Suitable materials for masking layer 204 include nitride. Nitride to form masking layer 204 may be deposited by a variety of chemical vapor deposition ("CVD") methods, including low-pressure, plasma-enhanced, and remote plasma-enhanced techniques. Low-pressure CVD techniques to form nitride include reacting dichlorosilane and ammonia at about 700° C. Plasma- and remote plasma-enhanced techniques for depositing nitride include reacting silane and ammonia at a temperature of about 50–350° C. Masking layer 204 is preferably deposited to be about 100–700 angstroms thick. If masking layer 204 is made of nitride, a pad layer 202 made of oxide can reduce the stresses that inherently exist between deposited nitride (in this case, masking layer 204) and single crystal silicon (semiconductor substrate 200). Pad layer 202 may not be necessary, however, if masking layer 204 is composed of a material of other than nitride and that material does not have substantial compatibility problems with semiconductor substrate 200.

Figure 5:
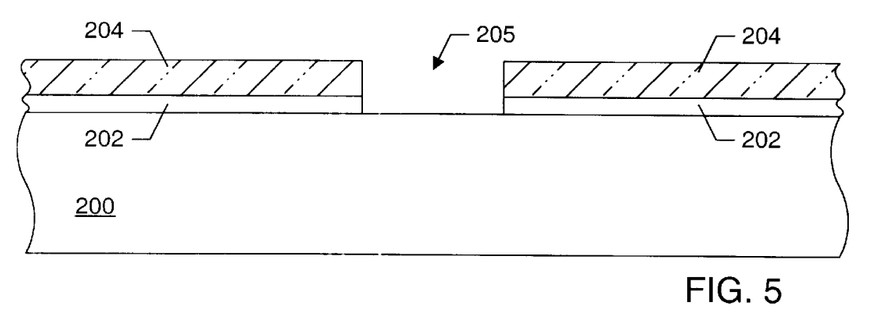
FIG. 5 is a partial cross-sectional view of the semiconductor topography, wherein a window is patterned in the masking layer and the pad layer according to a processing step subsequent to FIG. 4.

FIG. 5 depicts a subsequent processing step in which masking layer 204 and pad layer 202 are patterned to form window 205. Window 205 is preferably formed using a dry etch process with a high degree of anisotropy. As such, the sidewalls of masking layer 204 and pad layer 202 exposed by the formation of window 205 are preferably substantially vertical. Photoresist (not shown) may be spun on, exposed, and developed as is well known in the art to define the pattern used to etch window 205.

Figure 6:
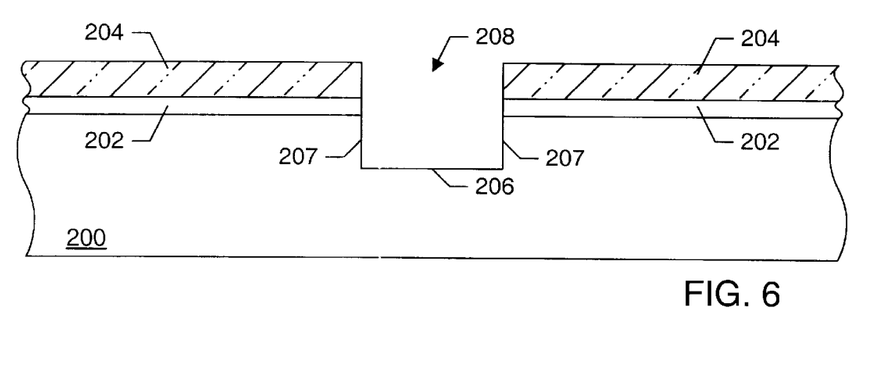
FIG. 6 is a partial cross-sectional view of the semiconductor topography, wherein a trench is patterned in the semiconductor substrate according to a processing step subsequent to FIG. 5.

FIG. 6 depicts a subsequent processing step in which trench 208 is patterned within a field region of semiconductor substrate 200. The trench is preferably defined within an upper portion of semiconductor substrate 200 by trench floor 206 and trench sidewalls 207. Trench 208 is preferably formed by removal of portions of semiconductor substrate 200 in an anisotropic dry etch process. The etch process used to form the trench may be undertaken such that trench sidewalls 207 form an angle with the surface of semiconductor substrate 200 of about 60–90 degrees. The lateral dimensions (i.e., length and width) of trench 208 may be substantially defined by the corresponding lateral dimensions of window 205. The width of trench 208 may be as narrow as the minimum resolvable feature size of the process used to form the trench. In a preferred embodiment, trench 208 is about 0.20 microns wide. Trench 208 is preferably about 0.15–0.30 microns deep. Although certain trench dimensions are presently preferred, it is envisioned that trench 208 may be as wide, long, or deep as is possible to fabricate and still remain within the scope of the present invention.

Figure 7:
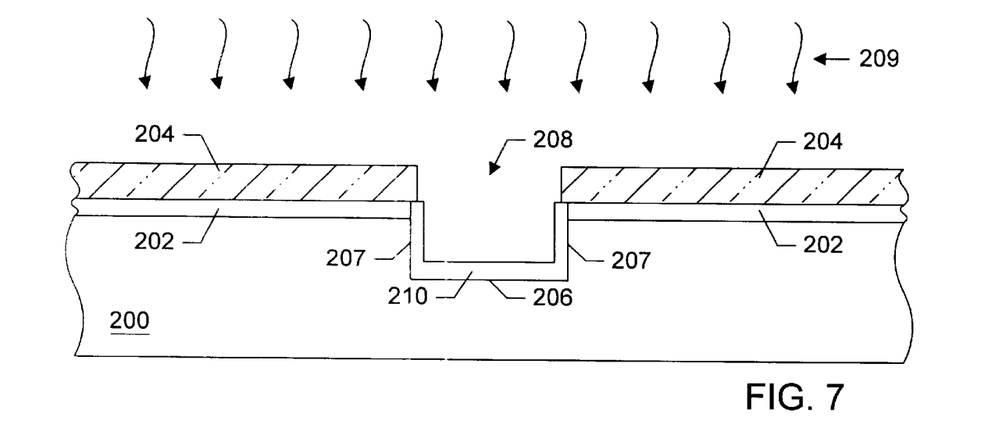
FIG. 7 is a partial cross-sectional view of the semiconductor topography, wherein a trench liner is formed upon the floor and sidewalls of the trench according to a processing step subsequent to FIG. 6.

FIG. 7 depicts a subsequent annealing step in which semiconductor substrate 200 is exposed to thermal radiation 209 in an oxygen-containing ambient. An RTA anneal at temperatures of 1000–1175° C. for 1–3 minutes is preferably used. Alternately, annealing may be carried out in a tube furnace at 1000–1175° C. for 5–15 min. As a result of annealing, trench liner 210, preferably containing oxide, may be grown on trench floor 206 and trench sidewalls 207. The etch process used to form trench 208 may result in the interface charge at trench floor 206 and trench sidewalls 207 being undesirably high. Growth of trench liner 210 preferably reduces these interface charges and makes for a better transition between the trench floor and sidewalls and any material subsequently deposited into trench 208. Trench liner 210 is preferably grown until it is about 200–500 angstroms thick.

Figure 8:
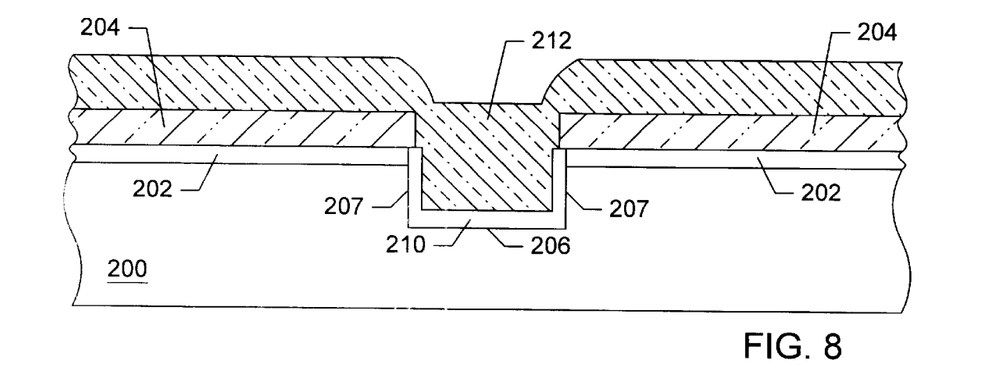
FIG. 8 is a partial cross-sectional view of the semiconductor topography, wherein a trench fill material is deposited within the trench according to a processing step subsequent to FIG. 7.

FIG. 8 depicts a subsequent processing step in which trench fill material 212 is deposited in trench 208 such that the upper surface of trench fill material 212 is above the upper surface of masking layer 204. Trench fill material 212 is preferably oxide that is CVD deposited from a silane or TEOS source. Trench fill material 212 may have nitrogen incorporated therein.

Figure 9:
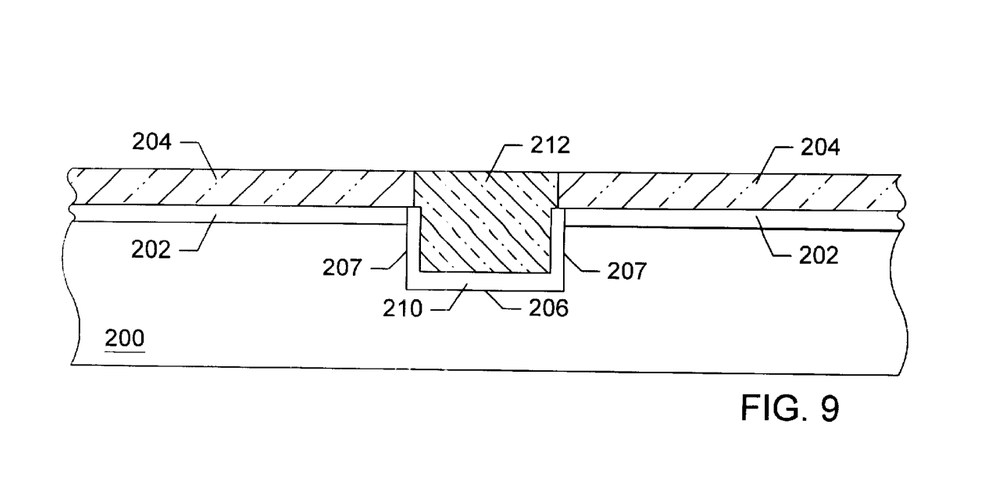
FIG. 9 is a partial cross-sectional view of the semiconductor topography, wherein the trench fill material is planarized according to a processing step subsequent to FIG. 8.

As shown in FIG. 9, trench fill dielectric 212 is then planarized such that the upper surface of trench dielectric 212 is substantially coplanar with the upper surface of masking layer 204. Planarization of trench fill material 212 may be carried out by use of chemical-mechanical polishing ("CMP") or a selective etchback technique. If planarization of trench fill material 212 is carried out by CMP, masking layer 204 may serve as a polish stop.

Figure 10:
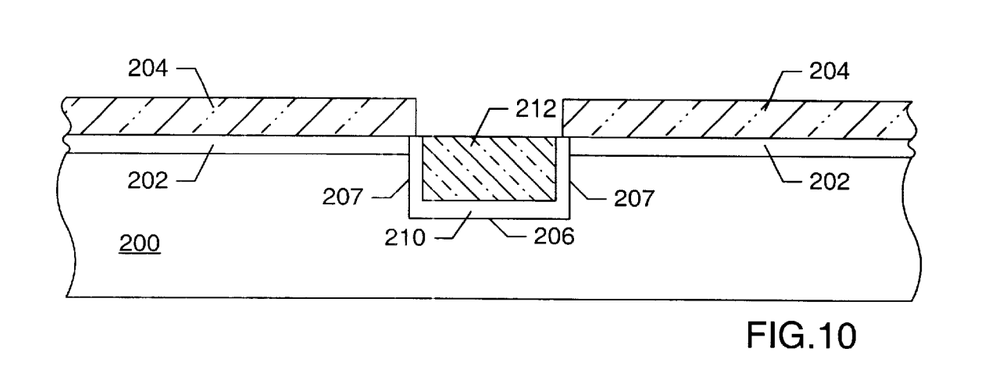
FIG. 10 is a partial cross-sectional view of the semiconductor topography, wherein an upper portion of the trench fill material is removed according to a processing step subsequent to FIG. 9.

FIG. 10 depicts a processing step in which an upper portion of trench fill material 212 may be removed. The upper surface of trench fill material 212 is thus lower than the upper surface of masking layer 204. After removing, the upper surface of trench fill material 212 is preferably substantially coplanar with the upper surface of pad layer 202. The upper portion of trench fill material 212 may be removed using an etch process that removes trench fill material 212 without substantially removing masking layer 204. The etch process is preferably anisotropic.

Figure 11:
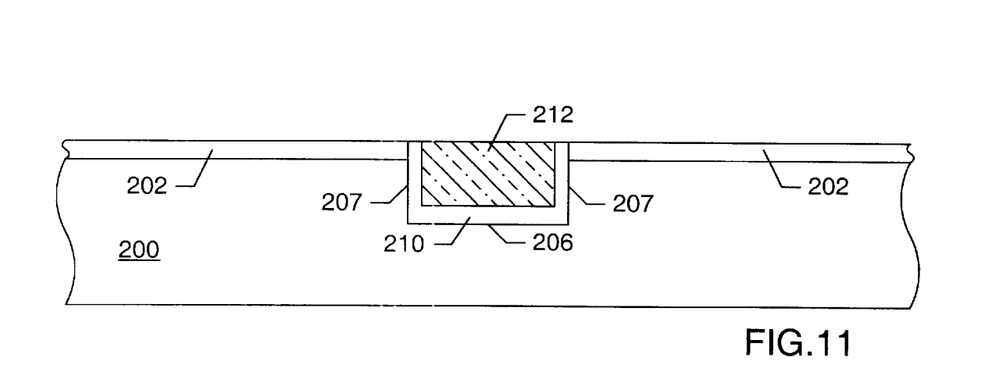
FIG. 11 is a partial cross-sectional view of the semiconductor topography, wherein the masking layer is removed according to a processing step subsequent to FIG. 10.

FIG. 11 illustrates a subsequent processing step in which masking layer 204 is removed. Removal of masking layer 204 may be undertaken by use of a wet or dry etch process. The etch process used to remove masking layer 204 preferably does not remove substantial portions of pad layer 202 or trench fill dielectric 212.

Figure 12:
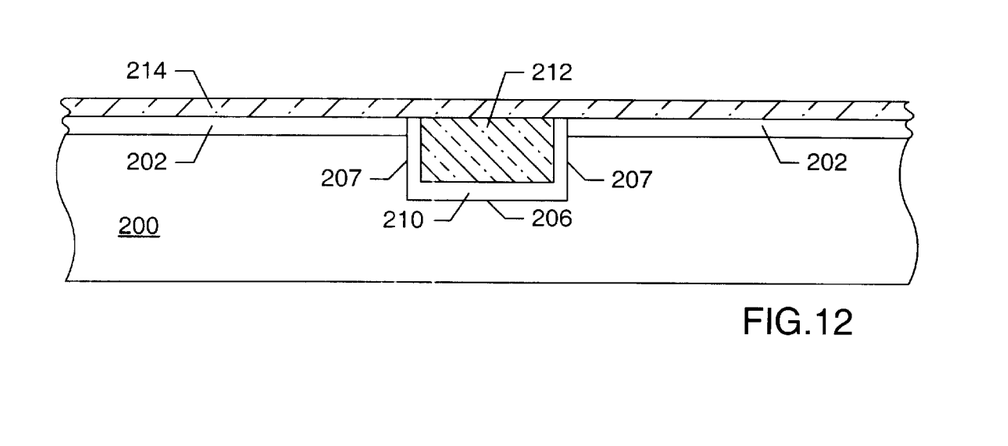
FIG. 12 is a partial cross-sectional view of the semiconductor topography, wherein a covering layer is deposited according to a processing step subsequent to FIG. 11.

FIG. 12 depicts a subsequent processing step in which covering layer 214 is deposited upon pad layer 202. Covering layer 214 is preferably composed of nitride. Covering layer 214 is preferably about 30–200 angstroms thick, and may be deposited in a manner similar to a masking layer 204 composed of nitride. Covering layer 214 is preferably deposited such that its upper surface is substantially horizontal.

Figure 13:
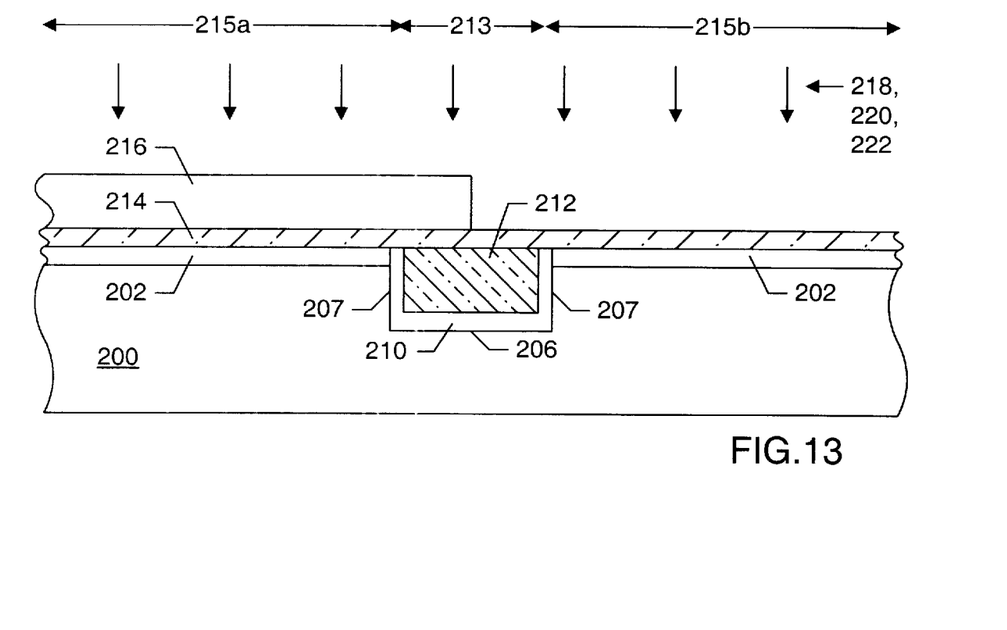
FIG. 13 is a partial cross-sectional view of the semiconductor topography, wherein a well implant, a $V_T$ adjust implant, and a punchthrough implant are forwarded into a second active area of the semiconductor substrate according to a processing step subsequent to FIG. 12.

As shown in FIG. 13, field region 213 of semiconductor substrate 200 is defined by the trench, and active regions 215 are defined in adjacent regions of the semiconductor substrate. Well implant 218, threshold voltage ("$V_T$") adjust implant 220, and punchthrough implant 222 may be selectively introduced into second active region 215b of semiconductor substrate 200. Selective introduction of implants 218, 220, and 222 preferably involves forming resist masking layer 216 above first active region 215a of semiconductor substrate 200 and implanting well implant 218, $V_T$ adjust implant 220, and punchthrough implant 222 into second active region 215b. These implants are preferably performed with implant energies sufficient to allow the implanted dopants to pass through the portions of covering layer 214 and pad layer 202 above second active region 215b. The implant energies used for implants 218, 220, and 222 are preferably not sufficient, however, to pass through resist masking layer 216 and the portions of covering layer 214 and pad layer 202 above first active region 215a. Well implant 218 preferably is n-type and forms an n-well within semiconductor substrate 200. $V_T$ adjust implant 220 may be performed to allow doping of the substrate without having to consider the effect of the substrate doping on the $V_T$ of the device. A p-type implant is used to effect a positive shift in $V_T$, while an n-type implant is used to effect a negative shift in $V_T$. Punchthrough implant 222 may be implanted to a depth near the bottom of the estimated depth of the to-be-formed junctions to prevent the occurrence of punchthrough.

Figure 14:
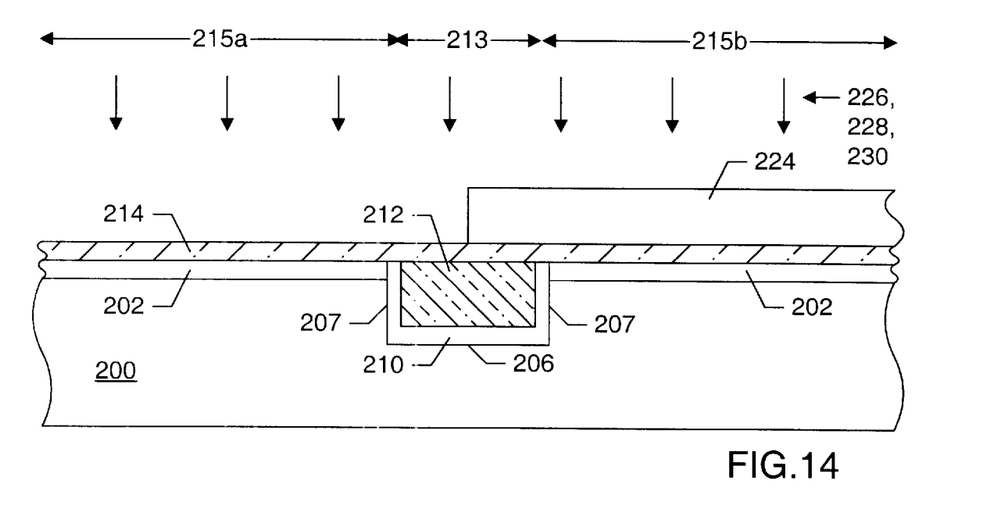
FIG. 14 is a partial cross-sectional view of the semiconductor topography, wherein a well implant, a $V_T$ adjust implant, and a punchthrough implant are forwarded into a first active area of the semiconductor substrate according to a processing step subsequent to FIG. 13.

FIG. 14 depicts the selective introduction of well implant 226, $V_T$ adjust implant 228, and punchthrough implant 230 into first active region 215a of semiconductor substrate 200. Selective introduction of well implant 226, $V_T$ adjust implant 228, and punchthrough implant 230 preferably involves forming resist masking layer 224 above second active region 215b. Well implant 226, $V_T$ adjust implant 228, and punchthrough implant 230 may then be implanted into active region 215a. These implants are preferably performed with implant energies sufficient to allow the implanted dopants to pass through the portions of covering layer 214 and pad layer 202 above first active region 215a. The implant energies used for implants 226, 228, and 230 are preferably not sufficient, however, to pass through resist masking layer 224 and the portions of covering layer 214 and pad layer 202 above second active region 215b. Well implant 226 is preferably p-type, so that performing well implant 226 forms a p-well in first active region 215a. $V_T$ adjust implant 228 and punchthrough implant 230 may function similarly to $V_T$ adjust implant 220 and punchthrough implant 222. The dopant type for each of these implants is preferably configured to the doping type of the well formed within the active region in which the implant is performed.

In many conventional trench isolation processes, the nitride masking layer and oxide pad layer utilized during formation and filling of the trench are stripped and an implant oxide layer is grown over the surface of semiconductor substrate 200. The well, $V_T$ adjust, and punchthrough implants are then performed through the implant oxide layer. In the present method, covering layer 214 and pad layer 202 may be left in place during the implantation of at least a first dopant (preferably well implant 218) into second active region 215b and at least a second dopant (preferably well implant 226) into first active region 215a. Eliminating the need to grow an implant oxide layer removes a process step and simplifies integrated circuit manufacture.

Figure 15A:
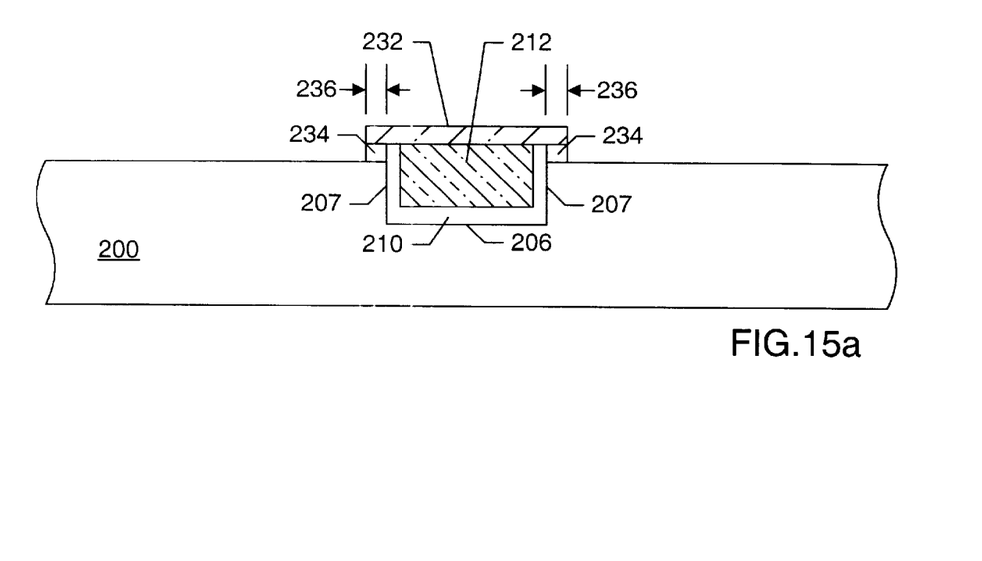
FIG. 15a is a partial cross-sectional view of the semiconductor topography, wherein a protective layer is formed above the trench according to a processing step subsequent to FIG. 14.
Figure 15B:
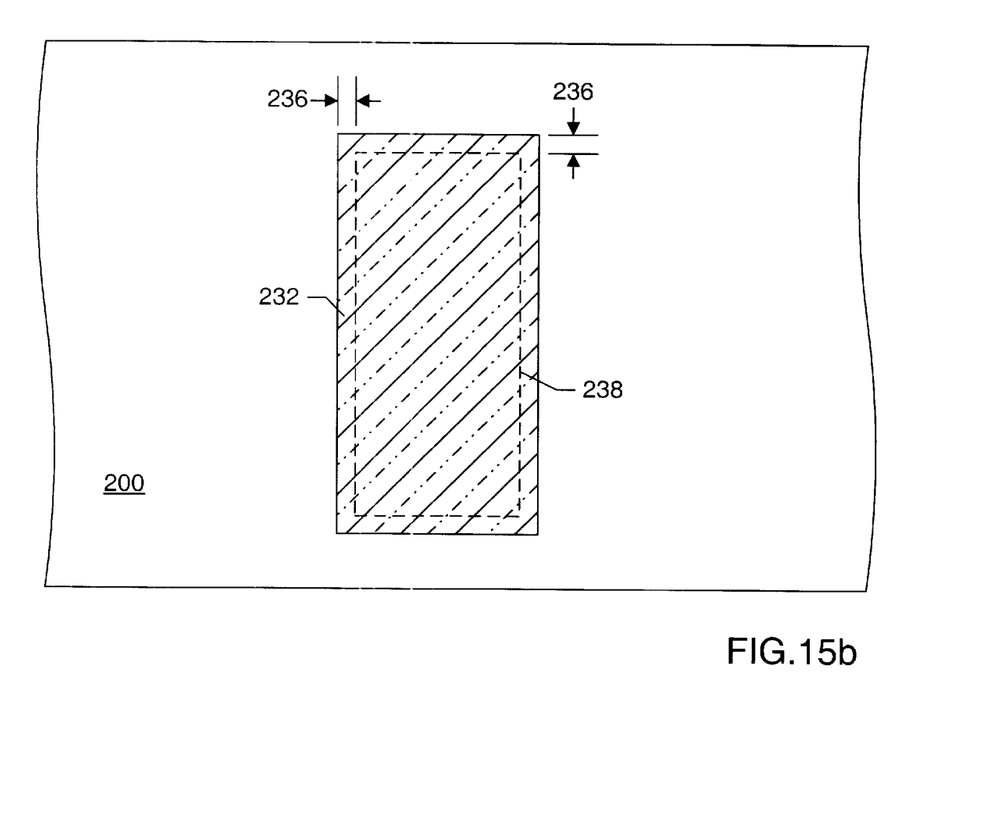

FIGS. 15a and 15b depict a processing step in which protective layer 232 is formed above the trench. Trench surface boundaries 238 are defined where trench sidewalls 207 intersect the upper surface of semiconductor substrate 200. The protective layer preferably covers the trench and laterally extends a first distance 236 beyond the trench surface boundaries. As can be seen in FIG. 15b, protective layer 232 not only extends a first distance 236 beyond trench surface boundaries 238 widthwise, but also lengthwise. Because it is desirable to prevent any erosion of trench fill material 212 at trench surface boundaries 238, first distance 236 is preferably no less than about 0.02 microns. To keep from encroaching on the adjacent active regions too much, however, first distance 236 is preferably no greater than about 0.10 microns. Protective layer 232 is preferably at least about 30 angstroms thick to help ensure that trench fill material 212 remains protected during all subsequent processing steps. Protective layer 232 is preferably no greater than about 200 angstroms thick, however, because of step height problems and other difficulties that may be caused by an isolation structure that is too far above the surface of semiconductor substrate 200. Protective layer 232 is preferably composed of nitride and is substantially free of oxide. Consequently, oxide etch steps occurring after trench formation may be undertaken such that substantial portions of the protective layer are not removed.

Protective layer 232 is preferably patterned in an anisotropic dry etch process that removes portions of covering layer 214 external to the dimensions of protective layer 232. The mask used to define the pattern for protective layer 232 is preferably sized up from the mask used to pattern window 205 (and thus trench 208) by first distance 236 in all directions. In addition, the patterning process used to form protective layer 232 also preferably forms pad layer portions 234 from pad layer 202 (see FIG. 15a). Pad layer portions 234 are preferably contained beneath protective layer 232 and are adjacent to trench fill material 212. Unlike protective layer 232, a substantial amount of pad layer portions 234 may be removed in subsequent processes that etch oxide. Since the widths of pad layer portions 234 are approximately equal to first distance 236, first distance 236 may be configured to provide a width of pad layer portions 234 sufficient to prevent complete erosion of these portions during subsequent processing steps.

Figure 16:
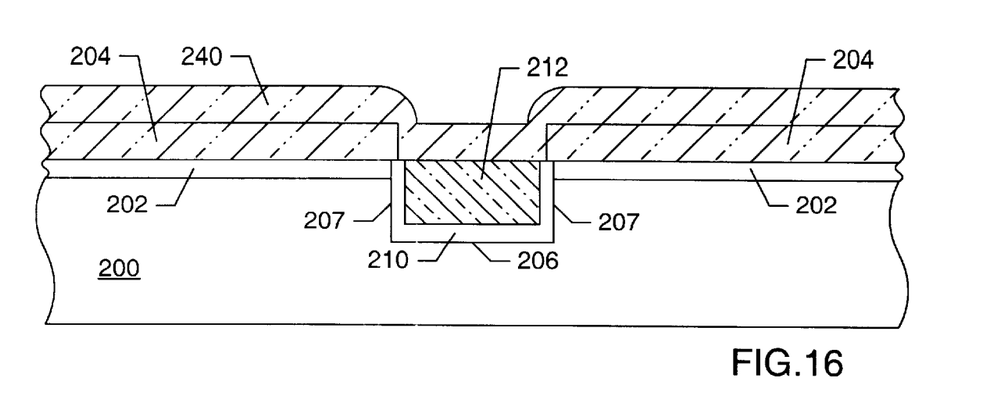
FIG. 16 is a partial cross-sectional view of the semiconductor topography, wherein a covering layer is deposited upon the masking layer and the trench fill material according to a processing step subsequent to FIG. 10.
Figure 17:
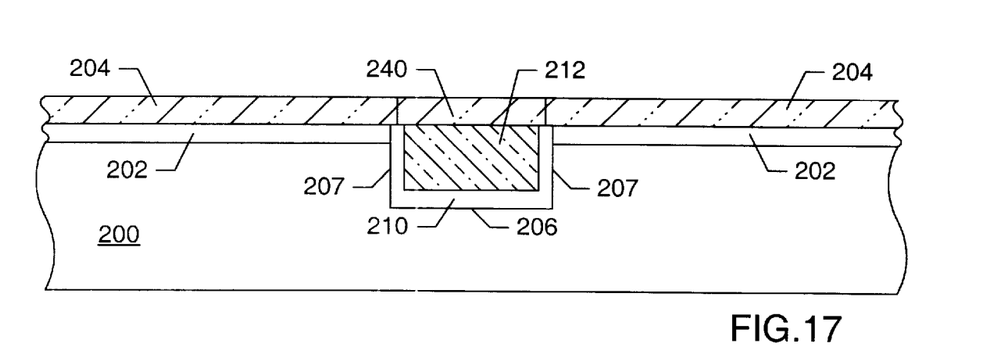
FIG. 17 is a partial cross-sectional view of the semiconductor topography, wherein the covering layer is planarized according to a processing step subsequent to FIG. 16.

FIGS. 16–17 illustrate another embodiment for forming protective layer 232. Following the removal of an upper portion of trench fill material 212 shown in FIG. 10, covering layer 240 is deposited upon masking layer 204 and trench dielectric 212 (see FIG. 16). Covering layer 240 is preferably composed of nitride, and may be deposited in a manner similar to covering layer 214. Covering layer 240 is preferably deposited such that the lowest point along the upper surface of covering layer 240 is at least as high as the upper surface of masking layer 204.

FIG. 17 illustrates a subsequent processing step in which covering layer 240 is planarized such that the upper surface of covering layer 240 is coplanar with the upper surface of masking layer 204. Protective layer 232 may be formed from covering layer 240 and masking layer 204. As stated above, the thickness of protective layer is preferably about 30–200 angstroms. Because the combined thickness of covering layer 240 and masking layer 204 may be above 200 angstroms after formation in this embodiment, covering layer 240 and masking layer 204 are preferably planarized. Planarization preferably occurs by means of chemical-mechanical polishing, and results in the thickness of both covering layer 240 and masking layer 204 being about 30–200 angstroms. Planarization of covering layer 240 also makes the upper surfaces of covering layer 240 and masking layer 204 substantially flat. As protective layer 232 is formed from these layers, the upper surface of protective layer 232 is preferably also substantially flat. The process flow depicted in FIGS. 13–15 may then be followed. In a subsequent processing step, select portions of masking layer 204 may be removed such that protective layer 232 (see FIG. 15) is formed from covering layer 240 and the remaining portions of masking layer 204.

Figure 18:
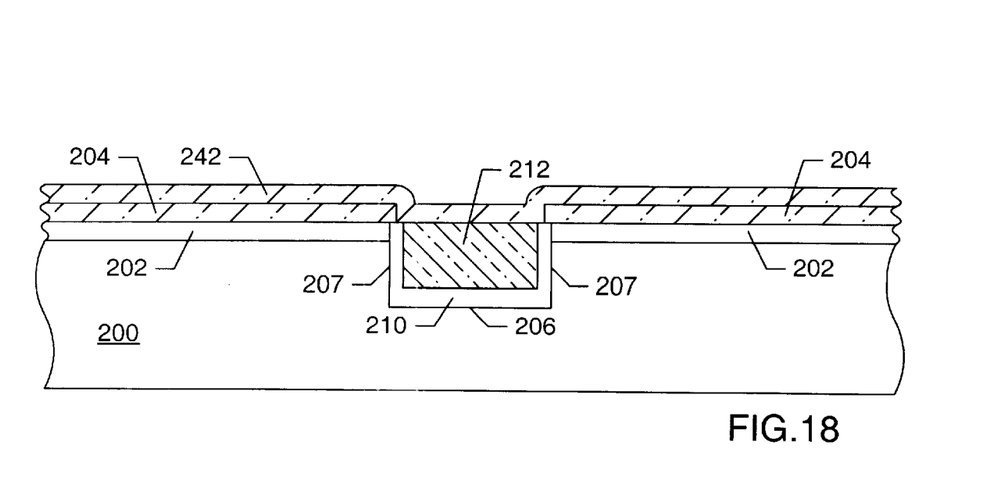
FIG. 18 is a partial cross-sectional view of the semiconductor topography, wherein a covering layer is deposited upon the masking layer and the trench fill material according to a processing step subsequent to FIG. 10.

An another embodiment for forming protective layer 232 is presented in FIG. 18. Following the removal of an upper portion of trench fill material 212 shown in FIG. 10, covering layer 242 is deposited upon masking layer 204 and trench dielectric 212. Covering layer 242 is preferably composed of nitride, and may be deposited in a manner similar to covering layers 214 and 240. As discussed above in relation to FIGS. 16 and 17, planarization of a covering layer deposited on masking layer 204 can be used to get the thickness of the resulting layer within the about 30–200 angstrom thickness range desired for protective layer 232. Covering layer 242 and masking layer 204, as shown in FIG. 18, are preferably sufficiently thin that planarization of these layers is not necessary. Because of the difficulties inherent in planarization, it may be beneficial to accept a slight loss of planarity if the need for planarization can be obviated. After deposition of covering layer 242, the process flow depicted in FIGS. 13–15 may be continued such that protective layer 232 is formed above the trench. In this embodiment, protective layer 232 is preferably formed by patterning of covering layer 242 and masking layer 204.

It will be appreciated to those skilled in the art having the benefit of this disclosure that both the semiconductor topography and the method for making an integrated circuit described herein are capable of being used with numerous applications involving active region isolation within integrated circuits. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A semiconductor topography, comprising:

a trench disposed within a field region of a semiconductor substrate, wherein said trench is defined in an upper portion of the semiconductor substrate by a trench floor and trench sidewalls, and wherein trench surface boundaries are defined where said trench sidewalls intersect an upper surface of the semiconductor substrate; and a protective layer arranged above said trench, wherein said protective layer covers said trench and laterally extends above the semiconductor substrate terminating between 0.02 and 0.10 microns beyond said trench surface boundaries, and wherein said protective layer consists essentially of nitride.

2. The semiconductor topography of claim 1, further comprising a trench fill material disposed within said trench, wherein said trench fill material comprises oxide, and further comprising a trench liner arranged upon said trench floor and trench sidewalls, and wherein said trench liner comprises oxide.

3. The semiconductor topography of claim 2, further comprising pad layer portions contained beneath said protective layer and adjacent to said trench fill material, wherein said pad layer portions each comprise a thickness of about 50–200 angstroms.

4. The semiconductor topography of claim 1, wherein an upper surface of said protective layer is substantially planar.

5. The semiconductor topography of claim 1, wherein said protective layer comprises a thickness of about 30–200 angstroms.

6. The semiconductor topography of claim 1, wherein said protective layer is substantially free of oxide.

7. The semiconductor topography of claim 3, wherein said pad layer portions comprise oxide.

8. The semiconductor topography of claim 2, wherein an upper surface of said trench fill material is elevationally above the upper surface of the semiconductor substrate.

9. A semiconductor topography, comprising:

a trench disposed within a field region of a semiconductor substrate, wherein said trench is defined in an upper portion of the semiconductor substrate by a trench floor and trench sidewalls, and wherein trench surface boundaries are defined where said trench sidewalls intersect an upper surface of the semiconductor substrate; and a protective layer arranged above said trench, wherein said protective layer covers said trench and laterally extends above the semiconductor substrate terminating between 0.02 and 0.10 microns beyond said trench surface boundaries, and wherein the protective layer comprises a material dissimilar from oxide so that substantial portions of the protective layer are not removed during an oxide etch step.

10. The semiconductor topography of claim 9, further comprising a trench fill material disposed within said trench, wherein an upper surface of the trench fill material is elevationally above the upper surface of the semiconductor substrate.

11. The semiconductor topography of claim 10, wherein said trench fill material comprises oxide, and further comprising a trench liner arranged upon said trench floor and trench sidewalls, and wherein said trench liner comprises oxide.

12. The semiconductor topography of claim 11, further comprising pad layer portions comprising oxide and contained beneath said protective layer and adjacent to said trench fill material, wherein said pad layer portions each comprise a thickness of about 50–200 angstroms.

13. The semiconductor topography of claim 9, wherein an upper surface of said protective layer is substantially planar.

14. The semiconductor topography of claim 13, wherein said protective layer comprises a thickness of about 30–200 angstroms.

15. The semiconductor topography of claim 9, wherein said protective layer consists essentially of nitride.

16. The semiconductor topography of claim 15, wherein said protective layer is substantially free of oxide.

* * * * *